(12) United States Patent
Choi et al.

(10) Patent No.: US 8,129,740 B2
(45) Date of Patent: Mar. 6, 2012

(54) SIDE VIEW LED PACKAGE AND BACK LIGHT MODULE COMPRISING THE SAME

(75) Inventors: Jong Bum Choi, Ansan-si (KR); Myung Hee Lee, Ansan-si (KR); Won Il Kim, Ansan-si (KR); Ji Seop So, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 213 days.

(21) Appl. No.: 12/411,860

(22) Filed: Mar. 26, 2009

(65) Prior Publication Data

US 2009/0242920 A1 Oct. 1, 2009

(30) Foreign Application Priority Data

Mar. 26, 2008 (KR) .................. 10-2008-0027732

(51) Int. Cl.
*H01L 33/00* (2010.01)
(52) U.S. Cl. ............................ 257/99; 257/98; 257/100
(58) Field of Classification Search ............. 257/98–100
See application file for complete search history.

(56) References Cited

U.S. PATENT DOCUMENTS

| 6,554,463 | B2* | 4/2003 | Hooker et al. ................. 362/555 |
| 2003/0057430 | A1* | 3/2003 | Rinaldi et al. .................. 257/99 |
| 2007/0102719 | A1* | 5/2007 | Yue .................................. 257/98 |
| 2007/0171673 | A1* | 7/2007 | Song et al. ..................... 362/612 |
| 2009/0189174 | A1* | 7/2009 | Lee et al. .......................... 257/99 |

FOREIGN PATENT DOCUMENTS

| JP | 2008-10562 | 1/2008 |
| KR | 2007-109348 | 11/2007 |

* cited by examiner

*Primary Examiner* — Wael Fahmy
*Assistant Examiner* — Bilkis Jahan
(74) *Attorney, Agent, or Firm* — H.C. Park & Associates, PLC

(57) ABSTRACT

Disclosed is a side view LED package that can be more accurately mounted onto a surface of a substrate such as a printed circuit board without distortion includes a first portion of a body allowing light to be emitted in front thereof, the first portion having a horizontal plane formed on a top or bottom side thereof; and a second portion of the body positioned backward with respect to a back end boundary line of the first portion, the second portion being formed with an inclined plane that is adjacent to the horizontal plane and has height decreased from the back end boundary line, wherein the inclined plane is partially formed with an added thickness portion that is flush with the horizontal plane.

14 Claims, 2 Drawing Sheets

SIDE VIEW LED PACKAGE AND BACK LIGHT MODULE COMPRISING THE SAME

CROSS-REFERENCE TO RELATED APPLICATION

This application claims priority from and the benefit of Korean Patent Application No. 10-2008-0027732, filed on Mar. 26, 2008, which is hereby incorporated by reference for all purposes as if fully set forth herein.

BACKGROUND OF THE INVENTION

1. Field of the Invention

The present invention relates to a side view light emitting diode (LED) package, and more particularly, to a side view LED package which can be more accurately mounted onto a surface of a substrate such as a printed circuit board (PCB) without being misaligned.

2. Discussion of the Background

Generally, a side view LED package is primarily used as a back light illumination device for displays and is configured to be aligned with a side surface of a light guide plate to allow light generated by the side view LED package to be projected into the light guide plate.

FIG. 1 and FIG. 2 illustrate a conventional side view LED package. Referring to FIG. 1 and FIG. 2, a side view LED package 30 is placed adjacent to a side surface 21 of a light guide plate 20. The side view LED package 30 includes a body that is divided into a front portion 32 and a rear portion 34. An LED chip 31 for emitting light when electric power is applied thereto is embedded within the body.

The light generated from the LED chip 31 passes through a light-transmittable encapsulant, which is partially provided in the front portion 32 of the body, and is then emitted through a front face of the front portion 32. Since the front face of the front portion 32 faces the side surface 21 of the light guide plate 20, the side view LED package 30 projects light into the light guide plate 20.

For ease of manufacture, the body of a conventional side view LED package 30 including a front portion 32 and rear portion 34 that is molded within a mold (not shown), may be shaped such that the rear portion 34 is narrower than the front portion 32. This configuration allows the body of the side view LED package 30 to be easily separated from the mold and results in bottom and top sides of the front portion 32 of the body being respectively formed with horizontal planes, while bottom and top sides of the rear portion 34 of the body are respectively formed with inclined planes having height differences with respect to a horizontal plane of the front portion 32.

When the side view LED package 30 constructed with this configuration is mounted onto a PCB 10 by a surface mounting technique (SMT), the height difference between the bottom surface of the front portion 32 and the bottom surface of the rear portion 34, can cause the side view LED package 30 to be skewed or misaligned when mounted onto the PCB 10, as shown in FIG. 2. Further, conventional surface mounting techniques require a vacuum picker 2 to attach to a top surface of the side view LED package 30 and then transfer the side view LED package 30 to a desired position. In this transfer method the height difference between the top surface of the front portion 32 and the top surface of the rear portion 34 can prevent the vacuum picker from attaching to, and transferring the side view LED package 30 in a level, horizontal position, which can lead to misalignment when the side view LED package 30 is surface mounted on the PCB 10 as shown in FIG. 1 and FIG. 2.

If the side view LED package 30 is misaligned when mounted onto the PCB, the front light emitting surface of the side view LED package 30 cannot be properly aligned with the side surface of the light guide plate 20, thereby causing the light emitting efficiency of the side view LED package 30 to be reduced.

SUMMARY OF THE INVENTION

The present invention provides a side view LED package, that can be more accurately surface mounted onto a PCB or the like by providing thickened portions on the rear portion of the body of the side view LED package to compensate for the height differences between the front portion of the body of the side view LED package and the rear portion of the body of the side view LED package.

Additional features of the invention will be set forth in the description which follows, and in part will be apparent from the description, or may be learned by practice of the invention.

The present invention discloses a side view LED package, which comprises a first portion of a body allowing light to be emitted in front thereof, the first portion having a horizontal plane formed on a top or bottom side thereof; and a second portion of the body positioned backward with respect to a back end boundary line of the first portion, the second portion being formed with an inclined plane that is adjacent to the horizontal plane and has height decreased from the back end boundary line, wherein the inclined plane is partially formed with a thickened portion that is flush with the horizontal plane.

The present invention also discloses a back light module comprising a light guide plate, a PCB, and a side view LED package. Here, the side view LED package includes a first portion of a body allowing light to be emitted in front thereof toward the light guide plate, the first portion having a horizontal plane formed on a top or bottom side thereof; and a second portion of the body positioned backward with respect to a back end boundary line of the first portion and formed with inclined plane from the back end boundary line, wherein a thickened portion is partially formed on the inclined plane and flush with the horizontal plane, wherein the thickened portion and the horizontal plane are closely contacted with the PCB.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
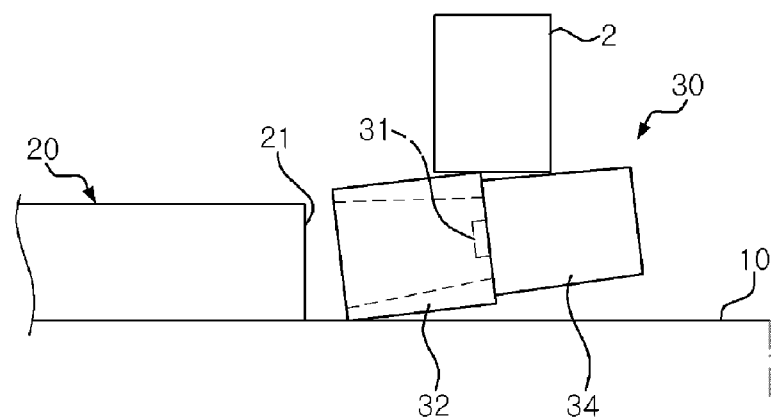
FIG. 1 is a side view illustrating a conventional side view LED package and a back light module.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 3:
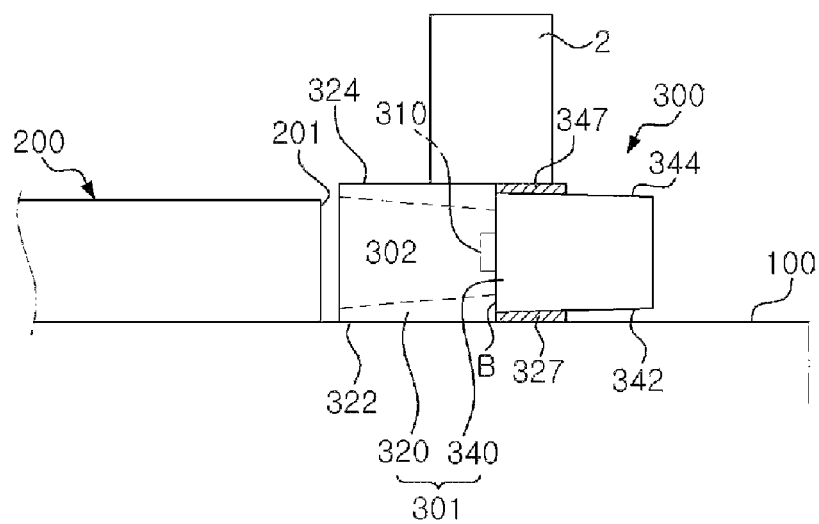
FIG. 3 is a side view illustrating a side view LED package and a back light module according to an exemplary embodiment of the present invention.

FIG. 3 is a side view illustrating a side view LED package and a back light module according to one embodiment of the present invention.

As depicted in FIG. 3, the back light module comprises a PCB 100, a light guide plate 200 and a side view LED package 300. The side view LED package 300 is located adjacent to a side surface 201 of the light guide plate 200. The side view LED package 300 includes a body 301 which includes a front portion 320 and a rear portion 340. An LED chip 310 for emitting light when electric power is applied thereto is embedded within the body 301. Although not shown, the application of electric power to the LED chip 310 is performed through lead frames extending from the interior of the body to the exterior thereof.

To permit light generated from the LED chip 310 to be emitted from the body 301 that is opaque, the body 301 includes a light-transmittable encapsulant 302. Since the encapsulant 302 is extended up to a front face of the front portion 320 of the body 301, the side view LED package 300 can emit light outwardly from the front portion 320 of the body 301.

The body 301 may be formed by a plastic molding process using a mold (not shown). To permit a body 301 molded within a mold to be more easily separated or released from the mold, the mold is shaped to have a wider front portion and a narrower rear portion. As such, although bottom and top sides of the front portion 320 of the body may be respectively formed with horizontal planes 322 and 324, bottom and top sides of the rear portion 340 of the body are respectively formed with inclined planes 342 and 344 which have height differences with respect to the horizontal planes 322 and 324 of the front portion 320.

Figure 4:
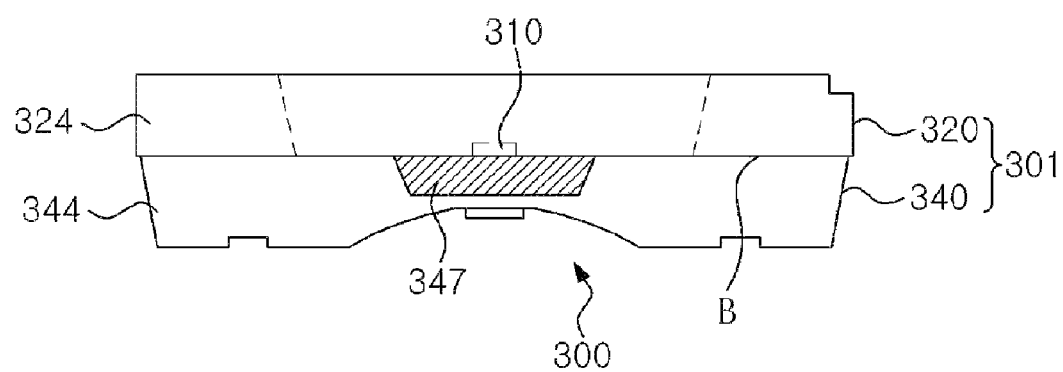
FIG. 4 is a plan view illustrating a side view LED package and a back light according to an exemplary embodiment of the present invention.

As a result of these height differences, and with reference to FIG. 4, a back end boundary line B is formed between the front and rear portions 320 and 340 of the body, i.e., on a back end of the front portion 320. Here, the rear portion 340 is positioned to the rear of the back end boundary line B, and the bottom inclined plane 342 of the rear portion 340 is configured such that its height is gradually decreased as the distance along the bottom inclined plane 342 from the back end boundary line B is increased. Similarly, the top inclined plane 344 of the rear portion 340 is configured such that its height is gradually decreased as the distance along the top inclined plane 344 from the back end boundary line B is increased.

Figure 2:
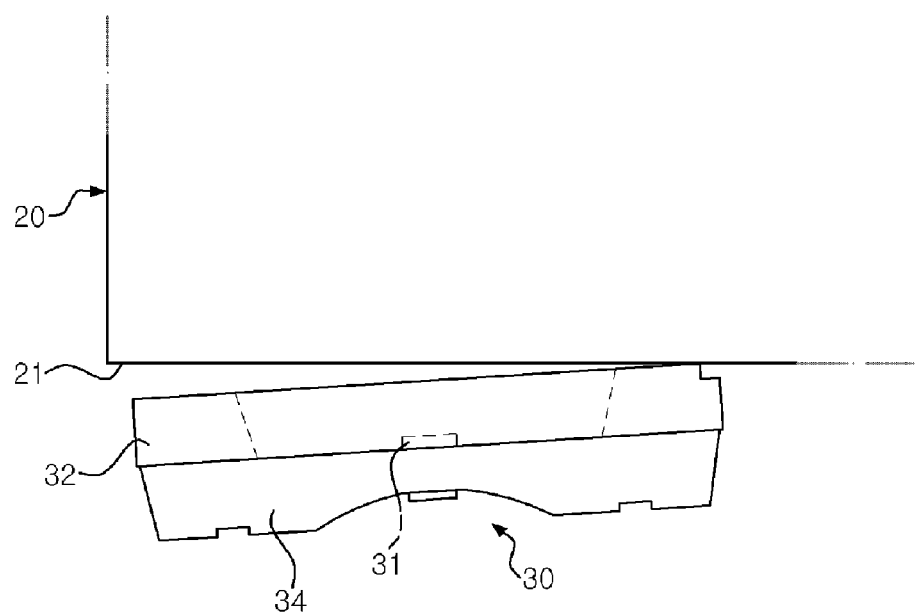
FIG. 2 is a plan view illustrating a conventional side view LED package and a back light module.

At a bottom side of the body 301, the height difference between the bottom horizontal plane 322 and the bottom inclined plane 342 may cause the side view LED package 300 to be misaligned when mounted onto the PCB 100 as previously described with respect to conventional devices as depicted in FIG. 1 and FIG. 2. To reduce the risk of this condition, the side view LED package 300 according to this embodiment further includes a bottom thickened portion 327 that compensates for the height differences caused by the inclination of the bottom inclined plane 342. As shown by the hatched portion in FIG. 3, the bottom thickened portion 327 on the bottom of body 301 may be arranged on a portion of the bottom inclined plane 342 and is flush with the bottom horizontal plane 322. In the plastic molding process of the body 301, the bottom thickened portion 327 can be formed such that it extends from the back end boundary line B to a region of the bottom inclined plane 342.

Accordingly, the bottom horizontal plane 322 and the bottom thickened portion 327 formed on the bottom inclined plane 342 are in surface to surface contact with a surface of the PCB 100, so that the side view LED package 300 can be mounted on the PCB 100 with a reduced risk of being misaligned.

Further, a top side of the body 301 may also be formed with a top thickened portion 347 to compensate for the height difference between the top horizontal plane 324 and the top inclined plane 344. As shown by the hatched portion in FIG. 3, the top thickened portion 347 may be arranged on a portion of the top inclined plane 344 of the body 301 and is flush with the top horizontal plane 324 of the body 301. In one embodiment, in the plastic molding process of the body 301, the top added thickness portion 347 may be formed such that it extends from the back end boundary line B to a region of the top inclined plane 344.

Since the top thickened portion 347 provides a relatively wide horizontal surface, to which a vacuum picker 2 can attach, the side view LED package 300 can be more accurately mounted onto the PCB 100 since the side view LED package 300 can be picked up in a level, horizontal position by the vacuum picker 2. Accordingly, the top thickened portion 347 also allows the side view LED package 300 to be mounted to the PCB 10 with a reduced risk of misalignment.

The bottom and top thickened portions 327 and 347 may be molded as an integral part of the body 301 of the side view LED package 300, or alternatively the body 301 may be formed first and then the bottom and top thickened portions 327 and 347 may be formed as additional members which are subsequently attached to the body 301.

FIG. 4 is a plan view illustrating a side view LED package 300 according to this embodiment. As depicted therein, the top thickened portion 347 is disposed on a portion of the top inclined plane 344 of the body 301. Further, although not shown in FIG. 4, the bottom thickened portion 327 (see FIG. 3) of an approximately similar shape to the top thickened portion 347 may be disposed on a portion of the bottom inclined portion of the body 301. When disposed in this manner, the top thickened portion 347 and the bottom thickened portion 327 extend rearward from the back end boundary line B of the front portion 320 of the body 301 to partial regions of the inclined planes 342 and 344, respectively.

Thus, differences in height between the front portion 320 and rear portion 340 of body 301 are accommodated by the addition of the top thickened portion 347 and the bottom thickened portion 327. The addition of the top thickened portion enhances the mounting process by permitting a vacuum picker 2 to attach to the body 301 and transfer the body 301 to its mounting location in a more level, horizontal orientation. The addition of the bottom thickened portion 347 permits the mounting of the side view LED package 300 with a reduced risk of misalignment. By improving the mounting process in this fashion the side view LED package 300 can be more accurately placed with respect to the light guide plate 200 with a reduced risk of misalignment. Accurate placement thereby improves the amount of light that can be projected into the light guide plate 200 and contributes to enhancing the light efficiency of a back light module comprising a side view LED package in accordance with the exemplary embodiments of the present invention.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A side view light emitting diode (LED) package, comprising:
    a first portion of a light emitting body, the first portion comprising a first horizontal plane arranged on at least one of a top side and bottom side thereof; and
    a second portion of the light emitting body positioned rearwardly with respect to a back end boundary line of the first portion and comprising a first inclined plane arranged on at least one of a top side and bottom side thereof, the first inclined plane extending rearwardly from the back end boundary line; and
    a first thickened portion is arranged on the first inclined plane to be flush with the first horizontal plane, wherein the first thickened portion comprises a length along the back end boundary line that is less than a length of the second portion.

2. The LED package according to claim 1 wherein the first portion further comprises a second horizontal plane arranged on at least one of a top side and bottom side thereof.

3. The LED package according to claim 2 wherein the second portion further comprises a second inclined plane arranged on at least one of a top side and bottom side thereof, the second inclined plane extending rearwardly from the back end boundary line,
    wherein a second thickened portion is arranged on the second inclined plane to be flush with the second horizontal plane.

4. The side view LED package of claim 3, wherein the first thickened portion and the second thickened portion contact only the first portion of the light emitting body along the back end boundary line and the top side and bottom side of the second portion of the light emitting body, respectively, and
    wherein the thickness of the first portion of the light emitting body is equal to the thickness of the second portion of the light emitting body, the first thickened portion, and the second thickened portion together.

5. The side view LED package as claimed in claim 1, wherein the first thickened portion extends rearwardly from the back end boundary line to a region of the inclined plane.

6. The side view LED package as claimed in claim 1, wherein the light emitting body and first thickened portion are separately formed by a plastic molding process and fixedly attached to each other.

7. The side view LED package as claimed in claim 1, wherein the light emitting body is formed by a plastic molding process using a mold, and the first thickened portion is formed integrally with the body by a plastic molding process.

8. The side view LED package of claim 1, wherein the first thickened portion contacts only the first portion of the light emitting body along the back end boundary line and the top side or bottom side of the second portion of the light emitting body.

9. The side view LED package of claim 1, wherein the first thickened portion is four-sided in a cross-sectional view.

10. A back light module, comprising:
    a light guide plate;
    a Printed Circuit Board (PCB); and
    a side view light emitting diode (LED) package,
    wherein the side view LED package comprises:
        a first portion of a light emitting body that permits light to be emitted toward the light guide plate, the first portion having a first horizontal plane formed on a top or bottom side thereof; and
        a second portion of the body positioned rearwardly with respect to a back end boundary line of the first portion and formed with a first inclined plane that extends reawardly from the back end boundary line; and
        a first thickened portion arranged on a portion of the first inclined plane and flush with the first horizontal plane, the first thickened portion and the first horizontal plane in surface to surface contact with the PCB, wherein the first thickened portion comprises a length along the back end boundary line that is less than a length of the second portion.

11. The back light module according to claim 10 wherein the first portion further comprises a second horizontal plane formed on a top or bottom side thereof.

12. The back light module according to claim 10 wherein the second portion further comprises a second inclined plane that extends reawardly from the back end boundary line.

13. The back light module according to claim 10 wherein the first portion of the body and the second portion of the body are integrally formed with the first thickened portion by a plastic molding process.

14. The back light module according to claim 10 wherein the first portion of the body and the second portion of the body are separately formed from the first thickened portion, and then fixedly attached to each other.

* * * * *